United States Patent
Cheng et al.

(10) Patent No.: US 7,087,508 B2
(45) Date of Patent: Aug. 8, 2006

(54) METHOD OF IMPROVING SHORT CHANNEL EFFECT AND GATE OXIDE RELIABILITY BY NITROGEN PLASMA TREATMENT BEFORE SPACER DEPOSITION

(75) Inventors: Juing-Yi Cheng, Chi-Shan (TW); Chien-Hao Chen, Juangwei Shiang (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 10/697,833

(22) Filed: Oct. 30, 2003

(65) Prior Publication Data
US 2005/0095798 A1    May 5, 2005

(51) Int. Cl.
*H01L 21/3205*    (2006.01)

(52) U.S. Cl. ............ 438/585; 438/595; 438/798; 257/E21.176; 257/E21.177

(58) Field of Classification Search ............ 438/585, 438/595, 798, 303, 305; 257/E21.176, E21.177
See application file for complete search history.

(56) References Cited

U.S. PATENT DOCUMENTS

| | | | |
|---|---|---|---|
| 5,189,504 A | 2/1993 | Nakayama et al. | 257/422 |
| 5,425,843 A * | 6/1995 | Saul et al. | 438/694 |
| 5,567,638 A | 10/1996 | Lin et al. | 437/46 |
| 5,808,348 A | 9/1998 | Ito et al. | 257/410 |
| 5,872,049 A | 2/1999 | Gardner et al. | 438/585 |
| 5,990,517 A | 11/1999 | Irino | 257/339 |
| 6,323,519 B1 * | 11/2001 | Gardner et al. | 257/336 |
| 6,373,113 B1 | 4/2002 | Gardner et al. | 257/411 |
| 6,387,735 B1 * | 5/2002 | Ueda | 438/147 |
| 6,593,198 B1 * | 7/2003 | Segawa | 438/303 |

* cited by examiner

*Primary Examiner*—Trung Dang
(74) *Attorney, Agent, or Firm*—Haynes and Boone, LLP

(57) ABSTRACT

A new method is provided for manufacturing a gate electrode. A layer of gate material, such as polysilicon, is deposited, patterned and etched, defining the poly gate electrode structure. LDD and pocket impurity implants are performed, the LDD profile is created by a rapid thermal anneal. Next and of critical importance to the invention, a $N_2$ or $O_2$ or $N_2$ based plasma treatment is performed to eliminate defects in the exposed surface of the silicon substrate and sidewalls of the defined gate electrode that occur as a result of the etch of the layer of gate material. Then gate spacers are formed.

32 Claims, 3 Drawing Sheets

METHOD OF IMPROVING SHORT CHANNEL EFFECT AND GATE OXIDE RELIABILITY BY NITROGEN PLASMA TREATMENT BEFORE SPACER DEPOSITION

BACKGROUND OF THE INVENTION (1) Field of the Invention

The invention relates to the fabrication of integrated circuit devices, and more particularly, to a method for improving the short channel effect and the gate oxide reliability of CMOS devices by nitrogen plasma treatment before spacer deposition.

(2) Description of the Prior Art

Conventional methods of forming CMOS gate electrodes in or over an active device region of a semiconductor substrate are well known in the art. The active device region is typically defined by field oxide regions, which electrically isolate the active region of the substrate from the surrounding surface areas of the substrate.

Substrate conductivity in the active surface area is first established by providing n/p-well impurity implants into the active surface of the substrate. In fabricating a CMOS device, a layer of gate material such as polysilicon is formed over a layer of thin oxide that is formed over the active device region of the substrate. The polysilicon layer is then masked and both the exposed polysilicon and the underlying thin layer of oxide are etched to define a poly-silicon gate electrode that is separated from the substrate by the thin layer of gate oxide. A self-aligned implant of for instance N-type dopant then forms lightly doped diffusion (LDD) source/drain regions in the substrate as a first phase of forming the substrate N-type source/drain regions of the CMOS device. After the formation of for instance oxide sidewall spacers on the sidewalls of the polysilicon gate and of the gate oxide, a second N-type impurity implant is performed to set the conductivity of the gate region to a desired level and to complete the N+ source/drain regions of the gate electrode.

Contact surfaces of the gate electrode may then be salicided by depositing for instance a layer of titanium over the structure, more specifically over the exposed surfaces of the N+ source/drain regions and the gate electrode. The deposited titanium is annealed, thereby causing the titanium to react with the underlying N+ silicon of the substrate of the source/drain regions and the doped polysilicon gate to form titanium salicide over these surfaces.

The gate electrode is completed by forming a layer of dielectric material, typically silicon oxide, over the gate electrode. Contact openings are etched in the dielectric and a metallization layer is formed to provide contacts to the salicided surfaces of the source/drain regions and over the polysilicon gate.

Semiconductor device performance improvements require the reduction of device dimensions from which follows in increase in device density. As devices and the therefrom created circuits are scaled down to sub-0.25 μm dimensions for Ultra Large Scale Integrated (ULSI) technology devices, the quality of the spacers that are created over sidewalls of the gate electrode becomes increasingly more important in view of the increased demands of device insulation. Continued reduction in device dimensions imposes increased demands on the profile of the impurity implants, which results in the need to reduce the thermal cycle of the gate electrode.

During conventional processing steps for the creation of a gate electrode, specifically during the etch of the layer of gate material to create the gate electrode, the etch results in damage to the silicon substrate, which is exposed during the etch, and to sidewalls of the patterned and etched layer of gate material. To repair this damage, a step of re-oxidation is typically performed, this step removes the damage that has resulted from the etch of the layer of gate material. The need however to reduce the thermal budget during the creation of a gate electrode imposes the need to remove the re-oxidation step. This removal of the re-oxidation must be compensated for since the damage in the silicon substrate and the sidewalls of the etched layer of gate material must as yet be prepared. There is a need for the highlighted compensation and repair of etch induced damage.

U.S. Pat. No. 5,808,348 (Ito et al.) shows a nitrided gate oxide process.

U.S. Pat. No. 6,373,113 B1 (Gardner et al.) shows a nitrogenated gate structure and method.

U.S. Pat. No. 5,990,517 (Irino) discloses a process to introduce nitrogen into a gate dielectric.

U.S. Pat. No. 5,872,049 (Gardner et al.), U.S. Pat. No. 5,567,638 (Lin et al.) and U.S. Pat. No. 5,189,504 (Nakayama et al.) are related patents.

SUMMARY OF THE INVENTION

A principal objective of the invention is to prevent etch damage during the creation of a gate electrode while maintaining a low thermal budget.

In accordance with the objectives of the invention a new method is provided for the creation of gate spacers over sidewalls of a gate electrode. A layer of gate material, such as polysilicon, is deposited, patterned and etched, defining the poly gate electrode structure. LDD and pocket impurity implants are performed, the LDD profile is created by a rapid thermal anneal. Next and of critical importance to the invention, a $N_2$ or $O_2$ or $N_2$ based plasma treatment is performed to eliminate defects in the exposed surface of the silicon substrate and sidewalls of the defined gate electrode that occur as a result of the etch of the layer of gate material. Then gate spacers are formed.

DESCRIPTION OF THE PREFERRED EMBODIMENTS

Figure 1:
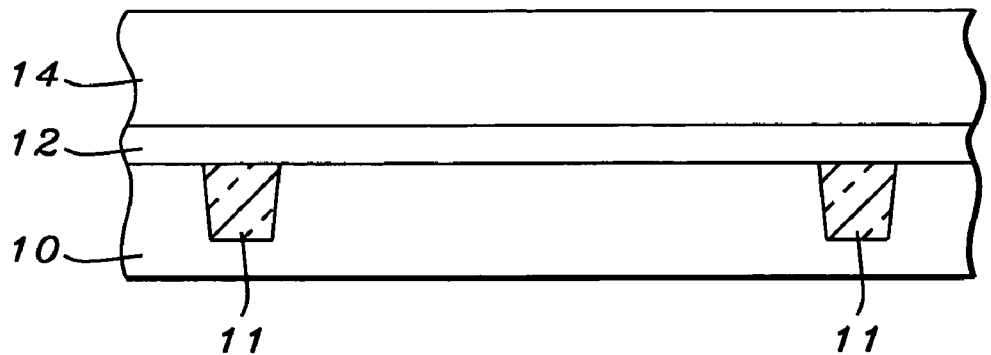
FIG. 1 shows the cross section of a substrate, active surface regions has been defined, layers of gate oxide and gate material have been deposited.

The invention is explained in detail using FIGS. 1 through 8 for this purpose. Referring first specifically to FIG. 1, there is shown the cross section of a substrate 10, a layer 12 of gate oxide has been created over substrate 10, a layer 14 of gate material has been deposited over the layer 12 of gate oxide. The active surface region of substrate 10 has been defined and is bounded by the regions 11 of Shallow Trench Isolation (STI).

Substrate 10 is a conventional, monocrystalline silicon substrate. STI regions 11 in substrate 10 can be made using a number of methods. For instance, one method is the Buried Oxide (BOX) isolation used for shallow trenches. The method involves filling the trenches with a chemical vapor deposition (CVD) silicon oxide ($SiO_2$) and then etched back or mechanically or chemically polished to yield a planar surface. The shallow trenches etched for the BOX process are anisotropically plasma etched into the silicon substrate and are typically between 0.5 and 0.8 micrometer (μm) deep. STI regions are typically formed around the active device to a depth between 4,000 and 20,000 Angstrom.

Another approach in forming STI regions 11 is to deposit silicon nitride on thermally grown oxide. After deposition of the nitride, a shallow trench is etched into the substrate using a mask. A layer of oxide is then deposited into the trench so that the trench forms an area of insulate dielectric which acts to isolate the devices in a chip and thus reduce the cross talk between active devices. The excess deposited oxide must be polished off and the trench planarized to prepare for the next level of metalization. The silicon nitride is provided to the silicon to prevent polishing of the masked silicon oxide of the device.

The layer 12 of pad oxide is grown on the bare silicon after the silicon surface has been cleaned. The layer consists of an about 150 Angstrom thick layer of $SiO_2$ and can be thermally grown on the substrate 10. The purpose of this layer 12 is to cushion the transition of the stress between the silicon substrate 10 and the subsequently deposited layer of polyimide for the formation of the gate electrode. In general, the thicker the layer 12 of pad oxide, the less edge force is being transmitted to the silicon substrate 10. Typically, a blanket pad oxide can be formed to a thickness of about 150 Angstrom through a thermal oxidation method at a temperature of about 900 degrees C. for a time period of about 10 to 20 minutes.

Layer 14 is a layer of gate material, preferably comprising polysilicon. Polysilicon layer 14 is typically deposited using low-pressure vapor deposition (LPCVD) using, for example, silane ($SiH_4$). The thickness of polysilicon layer 14 is between about 1,500 and 4,000 Angstrom.

Layer 14 of polysilicon is created using a number of methods, following are illustrative examples of these methods.

A heavily doped layer 14 is created by depositing a layer of polysilicon using LPCVD processing to a thickness of between about 1,500 and 4,000 Angstrom at a temperature between about 550 and 750 degrees C. An ion implant procedure, using $PH_3$ at an energy between about 20 and 80 KeV and a dose between about 5E14 and 5E15 atoms/cm$^3$ is used to dope the polysilicon layer 14. An in-situ doped layer of polysilicon can also be used for this deposition.

A lightly doped layer 14 is created by depositing a layer of polysilicon using LPCVD processing to a thickness of between about 1,500 and 4000 Angstrom at a temperature between about 550 and 750 degrees C. An ion implant procedure, using $PH_3$ at an energy between about 20 and 80 KeV and a dose between about 1E14 and 5E14 atoms/cm$^3$ is used to dope the poly layer. An in-situ doped layer of polysilicon can also be used for this deposition.

Figure 2:
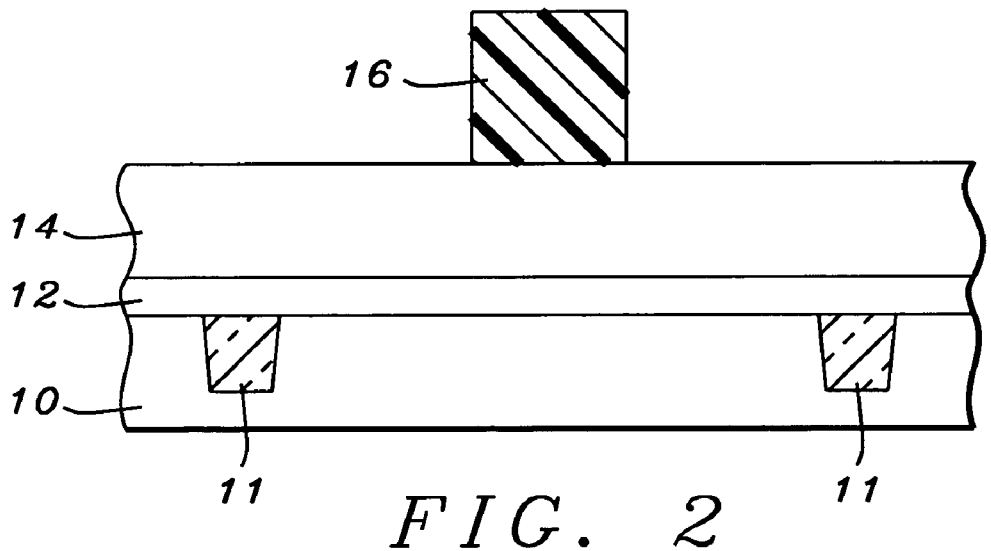
FIG. 2 shows a cross section after an etch blocking mask has been formed over the layer of gate material.

After the layer 14 of polysilicon has been deposited, an etch mask 16, FIG. 2, preferably comprising photoresist, is created over the layer 14 of polysilicon to define the structure of the gate electrode. The photoresist mask 16 is formed using conventional methods of photolithographic exposure and development.

The layer 14 of polysilicon can be etched using $SF_6$ and $SiO_2$ as etchant gasses. Polysilicon can also be etched using RIE or a high plasma density using an etchant gas having a high selectivity to oxide of layer 12, such as a gas containing clorine (Cl) species. The polysilicon gate structure can also be created via anisotropic RIE of the layer 14 polysilicon and the layer 12 of gate oxide using $Cl_2$ or $SF_6$ as an etchant.

Figure 3:
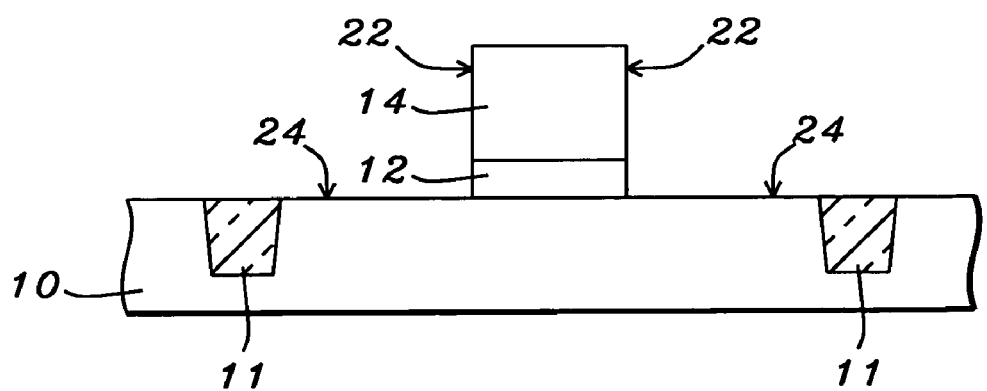
FIG. 3 shows a cross section after the layer of gate material and the layer of gate oxide have been etched, the etch blocking mask has been removed.

Specifically highlighted in the cross section of FIG. 3 are the surfaces 22, the sidewalls of the gate electrode structure 14, and surfaces 24, the exposed surface of the substrate 10. These surfaces 22 and 24 are the surfaces that are typically damaged by the etch of the layer 14, FIG. 2, of polysilicon. These are therefore the surfaces that must be treated in order to remove the there-in or there-over created damage.

Figure 4:
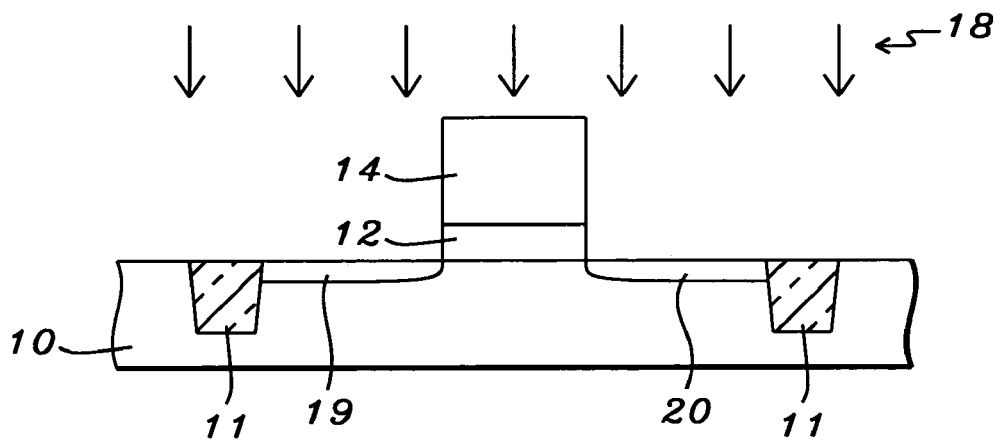
FIG. 4 shows a cross section during the LDD implantation into the substrate.

In the cross section that is shown in FIG. 3, the gate 14 of polysilicon is defined. LDD implant 18, FIG. 4, is now performed, self-aligned with the gate electrode 12/14, to form the Lightly Doped Diffusion regions of impurity regions 19/20 of the source/drain of the gate electrode in substrate 10.

LDD impurity implants can be performed applying a number of different parameters. A few examples are cited following.

For an P-channel CMOS device, p-type dopant species are implanted such as $BF_2$, for instance at a dose of between about 1.0E13 and 5.0E13 atoms/cm$^3$ and at an implant energy between about 40 and 60 KeV.

For an N-channel CMOS device, n-type dopant species are implanted such as arsenic or phosphorous, for instance at a dose of between about 1.0E13 and 1.0E14 atoms/cm$^3$ and at an implant energy between about 30 and 80 KeV.

Numerous variations are applied in the creation of LDD impurity regions in a substrate, dependent on device design specifics and requirements.

At this time a pocket impurity implant (not shown as a separate implant since this implant generally blends in with the LDD implant, modifying the profile of the LDD impurities 19/20) may also be performed. A pocket implant establishes a high punch-through voltage that results in a low off-state current of the gate electrode. Typical processing conditions for the pocket implant are as follows:

For NMOS: In
    energy: 50 to 250 keV
    dose: 5e12 to 1e14 atoms/cm$^2$
For PMOS: As
    energy: 50 to 250 keV
    dose: 5e12 to 1e14 atoms/cm$^2$.

In order to improve the efficiency of the pocket implant, the pocket implant (not shown) may be performed under an angle with substrate 10.

To profile the created LDD/pocket implants 19/20, a Rapid Thermal Anneal (RPA) is applied after the LDD/pocket implantation 18 has been performed. This process of RTA drives the dopant species and changes the dopant profile. The Rapid Thermal Anneal (RTA) can for example be performed at a temperature between about 700 and 750 degrees C. for a period of not longer than about 30 seconds.

Figure 5:
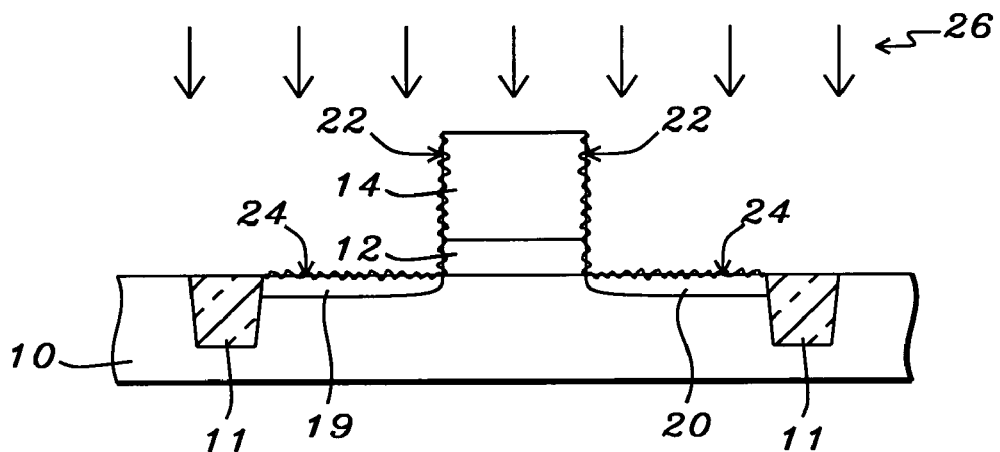
FIG. 5 shows a cross section during $N_2$ or $O_2$ of $H_2$ plasma exposure, passivating the exposed layer of gate material and the substrate.

In the cross section shown in FIG. 5, the surfaces 22 and 24 have been given a rough texture that represents the damage that is caused in these surfaces as previously highlighted. The structure that is shown in the cross section of FIG. 5 is now treated to a $N_2$ or $O_2$ or $H_2$ plasma treatment 26. The results of which are shown in the cross section of FIG. 6, that is the damage previously caused in surfaces 22 and 24 has been repaired ("passivated" in the meaning of "cancelled").

As example of processing conditions for the $N_2$ or $O_2$ or $H_2$ plasma treatment 26 the following parameters can be cited. The $N_2$ or $O_2$ or $H_2$ plasma 26 can be created under a condition in which a flow rate of a $N_2$ or a $O_2$ or a $H_2$ gas is about 100 sccm, a pressure of 100 Pa, a radio frequency power of about 0.005 $W/cm^2$, an electrode distance of about 40 mm and a substrate temperature of about 250 degrees C., a generated nitrogen plasma is irradiated to exposed surfaces 22 and 24 for about 10 seconds.

The above highlighted plasma treatment 26 is preferably a nitrogen based plasma treatment but is not limited there-to. Plasma treatment 26 can also comprise, as indicated above, an oxide based or a hydrogen based plasma treatment, these latter two plasma treatments have been demonstrated to also passivate damage incurred in surfaces 22 and 24, FIG. 5.

Figure 6:
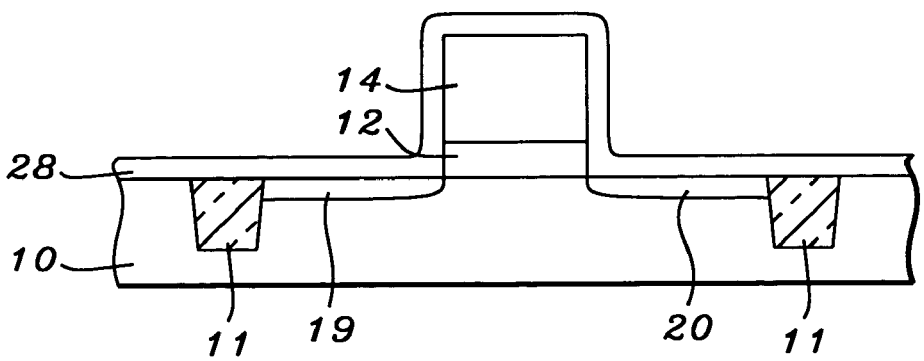
FIG. 6 shows a cross section of the gate electrode with a layer of hydrogen or nitride or oxide bases layer formed over the gate electrode and the substrate.
Figure 7:
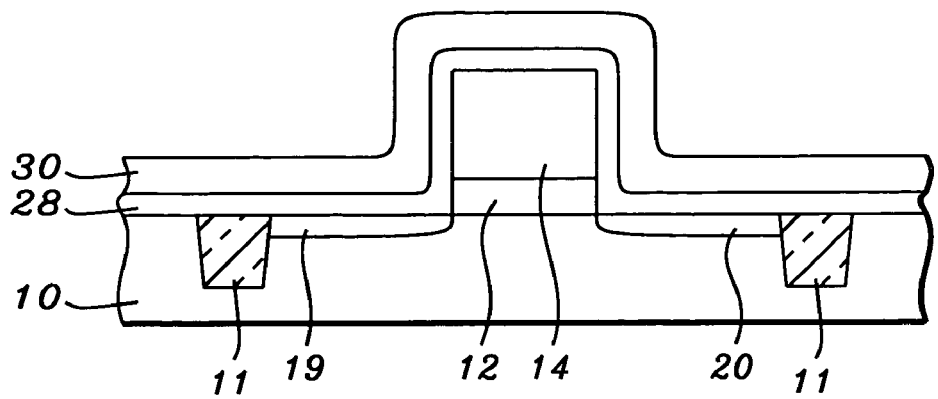
FIG. 7 shows a cross section after deposition of a layer of gate spacer material.

The cross section shown in FIG. 6 has been provided to demonstrate that surfaces 22 and 24 are now, after plasma treatment 26, FIG. 5, free of damage. A nitrogen or hydrogen or oxide based layer 28 has been formed over the previously damaged surfaces 22 and 24, thereby filling surface irregularities such as surface pitting and generally eliminating surfaces damage.

After the plasma treatment 26, FIG. 5, has been completed, resulting in the creation of layer 28, FIG. 6, gate spacers are now formed over the no longer damaged sidewalls of gate electrode 14. For this purpose, FIG. 7, a layer 30 of gate spacer material is deposited. For gate spacer layer 30 can be used for instance silicon nitride, silicon oxide, BSG, PSG, polysilicon, other materials preferably of a dielectric nature, CVD oxide formed from a TEOS source and amorphous materials that inhibit the deposition of epitaxial silicon thereupon.

As an example of the deposition of a layer of gate spacer material can be cited the deposition of a layer of silicon oxide, deposited using LPCVD or PECVD procedures, at a temperature between about 300 and 800 degrees C., to a thickness between about 200 and 5,000 Angstrom.

After the layer 30 of gate spacer material has been deposited, the gate spacers over sidewalls of gate electrode 14 are formed by etching the layer 30 of gate spacer material.

Silicon oxide spacers can for instance be formed via anisotropic RIE of a deposited silicon oxide layer, using $CHF_3$ or $CF_4$—$O_2$—He as an etchant.

Figure 8:
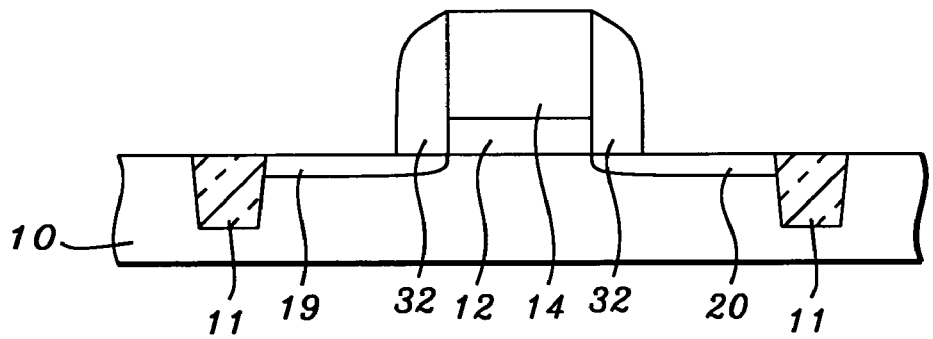
FIG. 8 shows a cross section after formation of the gate spacers.

The resulting gate spacers are shown as gate spacers 32 in the cross section of FIG. 8, wherein the layer 28 (FIG. 7) of hydrogen (or oxide or nitride) based plasma protection has effectively and functionally been integrated with the gate spacers and with the substrate 10.

Figure 9:
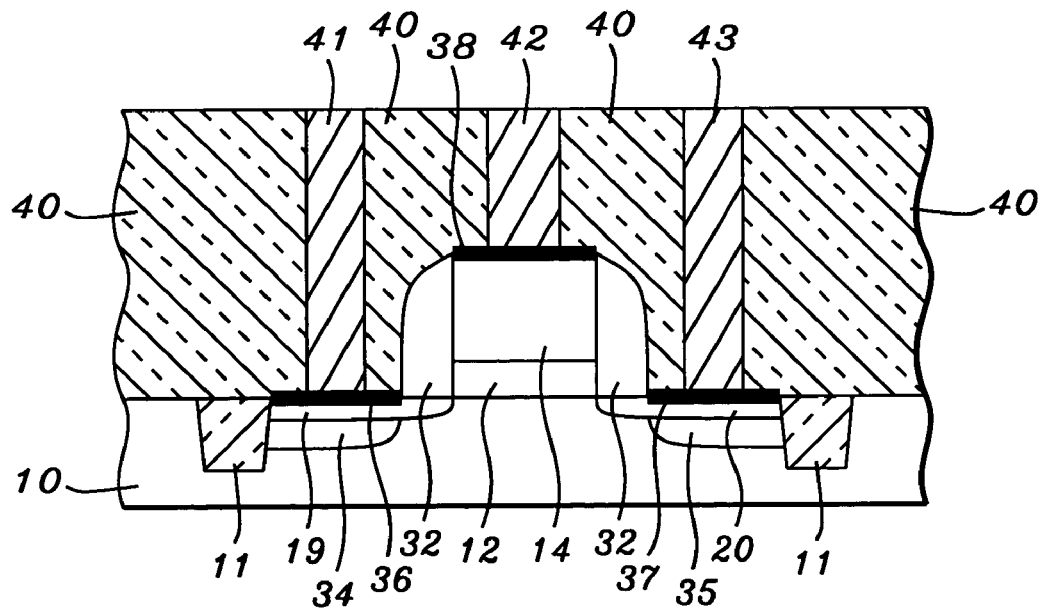
FIG. 9 shows the cross section of a completed gate electrode.

The gate electrode, shown in cross section in FIG. 8, is now ready for completion by creating, FIG. 9:
source and drain impurity implants 34/35 in the substrate, self-aligned with the gate spacers 32
salicidation 36/37 and 38 of the source/drain 34/35 surfaces and the gate electrode surface 14
a layer 40 of dielectric, and
openings created through layer 40 and
filling these openings with a conductive material, for the creation of interconnect 41, to the source region, 42 to the gate electrode and 43 to the drain region of the gate electrode.

The details relating to the steps highlighted in the cross section that is shown in FIG. 8 are not germane to the invention and are therefore not further discussed.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method of manufacturing a gate electrode of improved channel effect and improved gate oxide reliability, comprising:
   providing a substrate with a patterned and etched layer of gate oxide over the surface thereof and a patterned and etched layer of gate material over said patterned gate oxide, a LDD impurity implant into the substrate having been performed and annealed self-aligned with the patterned and etched layer of gate material;
   performing a plasma treatment directly on the patterned and etched layer of gate material and directly on exposed surfaces of the provided substrate, wherein a gas based layer is formed over the patterned and etched layer of gate material and the exposed surfaces of the provided substrate after performing the plasma treatment; and
   creating spacers over sidewalls of the patterned and etched layer of gate material.

2. The method of claim 1, the plasma exposure being a H2 based plasma exposure.

3. The method of claim 1, the plasma exposure being an O2 based plasma exposure.

4. The method of claim 1, the plasma exposure being a N2 based plasma exposure.

5. The method of claim 1, additionally pocket implants having been performed into the substrate after the LDD impurity implant have been performed.

6. The method of claim 1, additionally completing the gate electrode and conductive interconnects there-to after creating spacers over sidewalls of the patterned and etched layer of gate material.

7. A method of manufacturing a gate electrode of improved channel effect and improved gate oxide reliability, comprising:
   providing a substrate, an active surface having been bounded over the substrate by creating regions of field isolation;
   creating a layer of gate oxide over the active surface;
   creating a layer of gate material over the gate oxide;
   patterning and etching the layer of gate material and layer of the gate oxide, creating a gate electrode having sidewalls over the active surface, exposing the substrate;
   performing an impurity implant into the exposed substrate, self-aligned with the gate electrode;
   performing a plasma treatment directly on the sidewalls of the gate electrode and directly on the exposed substrate, wherein a gas based layer is formed over the sidewalls of the gate electrode and the exposed substrate after performing the plasma treatment;

creating spacers over the sidewalls of the gate electrode; and completing the gate electrode, including conductive interconnects there-to.

8. The method of claim 7, the plasma treatment being a H2 based plasma exposure.

9. The method of claim 7, the plasma treatment being an O2 based plasma exposure.

10. The method of claim 7, the plasma treatment being a N2 based plasma exposure.

11. The method of claim 7, the impurity implant comprising LDD implants.

12. The method of claim 7, the impurity implant comprising LDD implants followed by pocket implants.

13. The method of claim 7, the impurity implant being followed by an anneal.

14. A method of manufacturing a gate electrode of improved channel effect and improved gate oxide reliability, comprising:

provkding a substrate, an active surface having been bounded over the substrate by creating regions of field isolation;

creating a layer of gate oxide over the active surface;

creating a layer of gate material over the gate oxide;

patterning and etching the layer of gate material and layer of the gate oxide; creating a gate electrode having sidewalls over the active surface, exposing the substrate;

performing impurity implants into the exposed substrate, self-aligned with the gate electrode;

performing a H2 based plasma treatment directly on the sidewalls of the gate electrode and directly on the exposed substrate, wherein a hydrogen based layer is formed over the sidewalls of the gate electrode and the exposed substrate after performing the H2 based plasma treatment;

creating spacers over the sidewalls of the gate electrode; and completing the gate electrode, including conductive interconnects there-to.

15. The method of claim 14, the impurity implants comprising LDD implants.

16. The method of claim 14, the impurity implants comprising LDD implants followed by pocket implants.

17. The method of claim 14, the impurity implants being followed by an anneal.

18. A method of manufacturing a gate electrode of improved channel effect and improved gate oxide reliability, comprising:

providing a substrate, an active surface having been bounded over the substrate by creating regions of field isolation;

creating a layer of gate oxide over the active surface;

creating a layer of gate material over the gate oxide;

patterning and etching the layer of gate material and layer of the gate oxide, creating a gate electrode having sidewalls over the active surface, exposing the substrate; performing impurity implants into the exposed substrate, self-aligned with the gate electrode;

performing an O2 based plasma treatment directly on the sidewalls of the gate electrode and directly on the exposed substrate, wherein an oxide based layer is formed over the sidewalls of the gate electrode and the exposed substrate after performing the O2 based plasma treatment;

creating spacers over the sidewalls of the gate electrode; and completing the gate electrode, including conductive interconnects there-to.

19. The method of claim 18, the impurity implants comprising LDD implants.

20. The method of claim 18, the impurity implants comprising LDD implants followed by pocket implants.

21. The method of claim 18, the impurity implants being followed by an anneal.

22. A method of manufacturing a gate electrode of improved channel effect and improved gate oxide reliability, comprising:

providing a substrate, an active surface having been bounded over the substrate by creating regions of field isolation;

creating a layer of gate oxide over the active surface;

creating a layer of gate material over the gate oxide;

patterning and etching the layer of gate material and layer of the gate oxide, creating a gate electrode having sidewalls over the active surface, exposing the substrate; performing impurity implants into the exposed substrate, self-aligned with the gate electrode;

performing a N2 based plasma treatment directly on the sidewalls of the gate electrode and directly on the exposed substrate, wherein a nitrogen based layer is formed over the sidewalls of the gate electrode and the exposed substrate after performing the N2 based plasma treatment;

creating spacers over the sidewalls of the gate electrode; and completing the gate electrode, including conductive interconnects there-to.

23. The method of claim 22, the impurity implants comprising LDD implants.

24. The method of claim 22, the impurity implants comprising LDD implants followed by pocket implants.

25. The method of claim 22, the impurity implants being followed by an anneal.

26. A method of manufacturing a gate electrode of improved channel effect and improved gate oxide reliability, comprising:

providing a substrate, an active surface having been bounded over the substrate by creating regions of field isolation;

creating a layer of gate oxide over the active surface;

creating a layer of gate material over the gate oxide;

patterning and etching the layer of gate material and layer of the gate oxide, creating a gate electrode having sidewalls over the active surface, exposing the substrate;

performing a LDD impurity implant into the exposed substrate, self-aligned with the gate electrode;

performing a pocket impurity implant into the exposed substrate, self-aligned with the gate electrode;

performing an anneal of the LDD and pocket impurity implants;

performing a H2 based or an N2 based or an O2 based plasma treatment directly on the sidewalls of the gate electrode and directly on the exposed substrate, wherein a H2 based or an N2 based or an O2 based layer is formed over the sidewalls of the gate electrode and the exposed substrate after performing the H2 based or the N2 based or the O2 based plasma treatment;

creating spacers over the sidewalls of the gate electrode; and completing the gate electrode, including conductive interconnects there-to.

27. A method of manufacturing a gate electrode, comprising:
- providing a substrate;
- forming a patterned gate oxide over said substrate;
- forming a patterned gate material over said patterned gate oxide;
- forming a pair of LDD structures in said substrate and respectively adjacent to said patterned gate oxide;
- performing a plasma treatment directly to said patterned gate material and directly to said substrate, wherein a gas based layer is formed over the patterned gate material and the substrate after performing the plasma treatment; and
- respectively forming a pair of spacers over sidewalls of said patterned gate oxide and gate material following the plasma treatment.

28. The method of claim 27, the plasma treatment being a H2 based plasma treatment.

29. The method of claim 27, the plasma treatment being an O2 based plasma treatment.

30. The method of claim 27, the plasma treatment being a N2 based plasma treatment.

31. The method of claim 27, the forming a pair of LDD structures being followed by an anneal.

32. A method of manufacturing a gate electrode, comprising the sequential steps of:
- providing a substrate;
- forming a patterned gate oxide over said substrate;
- forming a patterned gate material over said patterned gate oxide;
- forming a pair of LDD structures in said substrate and respectively adjacent to said patterned gate oxide;
- performing a plasma treatment directly to said patterned gate material and directly to said substrate, wherein a gas based layer is formed over the patterned gate material and the substrate after performing the plasma treatment; and
- respectively forming a pair of spacers over sidewalls of said patterned gate oxide and gate material.

* * * * *